(12) United States Patent
Tseng et al.

(10) Patent No.: US 7,601,912 B2
(45) Date of Patent: Oct. 13, 2009

(54) PANEL AND HOUSING ASSEMBLY THAT IS ASSEMBLED AND DISASSEMBLED EASILY AND QUICKLY

(75) Inventors: Wen-Hung Tseng, Chung-Ho (TW); Hong-Wei Jhuang, Chung-Ho (TW); Ying-Yi Fan, Chung-Ho (TW)

(73) Assignee: Powercom Co., Ltd., Chung-Ho (TW)

( * ) Notice: Subject to any disclaimer, the term of this patent is extended or adjusted under 35 U.S.C. 154(b) by 0 days.

(21) Appl. No.: 11/939,594

(22) Filed: Nov. 14, 2007

(65) Prior Publication Data
US 2009/0122471 A1    May 14, 2009

(51) Int. Cl.
*H02G 3/08* (2006.01)
(52) U.S. Cl. .............................. 174/50; 174/53; 174/58; 439/535; 439/701; 248/906; 361/816; 361/800
(58) Field of Classification Search .................. 174/50, 174/53, 58, 64, 135; 439/535, 701, 717; 361/800, 816, 818; 248/906; 220/4.02
See application file for complete search history.

(56) References Cited
U.S. PATENT DOCUMENTS
6,492,590 B1 *  12/2002  Cheng ......................... 174/50

\* cited by examiner

*Primary Examiner*—Dhiru R Patel
(74) *Attorney, Agent, or Firm*—Alan Kamrath; Kamrath & Associates PA

(57) ABSTRACT

A panel and housing assembly includes a housing provided with a locking slot, a panel provided with a receiving space, and a locking tenon mounted between the housing and the panel and having a first end provided with an elastic portion received in the receiving space of the panel and a second end provided with a locking portion inserted into and locked in the locking slot of the housing. Thus, the panel is locked onto the housing by compressing the locking tenon and unlocked from the housing by pressing the press plate of the locking tenon so that the panel and housing assembly is assembled and disassembled easily and quickly without needing aid of any hand tool, thereby facilitating a user assembling and disassembling the panel and housing assembly.

18 Claims, 9 Drawing Sheets

PANEL AND HOUSING ASSEMBLY THAT IS ASSEMBLED AND DISASSEMBLED EASILY AND QUICKLY

BACKGROUND OF THE INVENTION

1. Field of the Invention

The present invention relates to a panel and housing assembly and, more particularly, to a panel and housing assembly for an electronic appliance, such as a computer, a servo, an uninterrupted power system (UPS) and the like.

2. Description of the Related Art

A conventional panel and housing assembly for an electronic appliance, such as a computer, a servo, an uninterrupted power system (UPS) and the like, in accordance with the prior art shown in FIG. 8 comprises a housing 100 provided with two ears 101 each having at least one screw bore 1011, and a panel 200 removably mounted on the housing 100 and provided with two lugs 201 each having a screw 300 screwed into the respective screw bore 1011 of the housing 100 to lock the panel 200 onto the housing 100. However, a user needs to screw or unscrew the screws 300 by aid of a hand tool, thereby causing inconvenience to the user when he wishes to remove the panel 200 from the housing 100.

Another conventional panel and housing assembly in accordance with the prior art shown in FIG. 9 comprises a housing 1000 provided with two ears 1001, two fastening members 3000 mounted on the two ears 1001 of the housing 1000, and a panel 2000 removably mounted on the housing 1000 and provided with two lugs locking hooks 2001 each snapped onto the respective fastening member 3000 to lock the panel 2000 onto the housing 1000. However, the conventional panel and housing assembly has a complicated structure, thereby increasing the costs of fabrication. In addition, the panel 2000 cannot be locked onto the housing 1000 when one of the fastening members 3000 is worn out or broken, thereby decreasing the lifetime of the conventional panel and housing assembly.

BRIEF SUMMARY OF THE INVENTION

In accordance with the present invention, there is provided a panel and housing assembly, comprising a housing provided with a locking slot, a panel removably mounted on the housing and provided with a receiving space, and a locking tenon mounted between the housing and the panel and having a first end provided with an elastic portion received in the receiving space of the panel and a second end provided with a locking portion inserted into and locked in the locking slot of the housing.

The primary objective of the present invention is to provide a panel and housing assembly that is assembled and disassembled easily and quickly.

Another objective of the present invention is to provide a panel and housing assembly, wherein the panel is locked onto the housing by compressing the locking tenon and unlocked from the housing by pressing the press plate of the locking tenon so that the panel and housing assembly is assembled and disassembled easily and quickly without needing aid of any hand tool, thereby facilitating a user assembling and disassembling the panel and housing assembly.

A further objective of the present invention is to provide a panel and housing assembly, wherein the locking tenon has a simplified structure so that the locking tenon is made easily, thereby decreasing the costs of fabrication of the panel and housing assembly.

A further objective of the present invention is to provide a panel and housing assembly, wherein the locking tenon is not worn out or broken easily during a long-term utilization, thereby increasing the lifetime of the panel and housing assembly.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
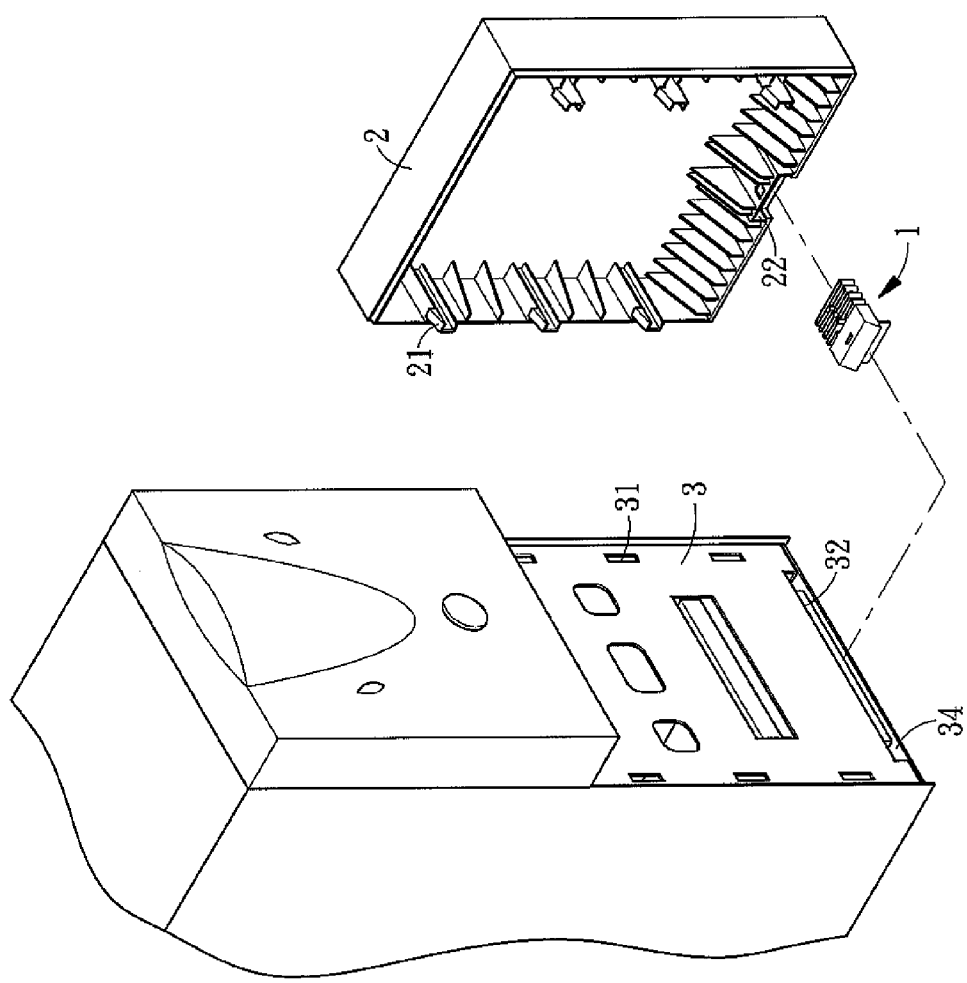
FIG. 1 is an exploded perspective view of a panel and housing assembly in accordance with the preferred embodiment of the present invention.

Referring to the drawings and initially to FIGS. 1-6, a panel and housing assembly in accordance with the preferred embodiment of the present invention comprises a housing 3 provided with a locking slot 32, a panel 2 removably mounted on the housing 3 and provided with a receiving space 22, and a locking tenon 1 mounted between the housing 3 and the panel 2 and having a first end provided with an elastic portion 11 received in the receiving space 22 of the panel 2 and a second end provided with a locking portion 12 inserted into and locked in the locking slot 32 of the housing 3.

The housing 3 is provided with a plurality of fixing slots 31 which are arranged in a line. Each of the fixing slots 31 of the housing 3 is perpendicular to the locking slot 32. Each of the fixing slots 31 of the housing 3 has an elongate shape and is disposed at a vertical state, and the locking slot 32 of the housing 3 has an elongate shape and is disposed at a horizontal state. The fixing slots 31 of the housing 3 are located at two opposite sides of the housing 3, and the locking slot 32 of the housing 3 is located at a bottom of the housing 3.

The panel 2 is provided with a plurality of fixing hooks 21 each inserted into and locked in a respective fixing slot 31 of the housing 3. Each of the fixing hooks 21 of the panel 2 has a size smaller than that of the respective fixing slot 31 of the housing 3 so that each of the fixing hooks 21 of the panel 2 is movable in the respective fixing slot 31 of the housing 3 when the panel 2 is movable relative to the housing 3. The fixing hooks 21 of the panel 2 are arranged in a line and are located at two opposite sides of the housing 3, and the receiving space 22 of the panel 2 is located at a bottom of the panel 2. The receiving space 22 of the panel 2 has a peripheral wall 24 which is formed on the bottom of the panel 2. The peripheral wall 24 of the panel 2 has a top provided with a limit hole 221 connected to the receiving space 22. The receiving space 22 of the panel 2 has a bottom wall 25 provided with an opening 26.

The locking tenon 1 is fully hidden in the receiving space 22 of the panel 2 when the elastic portion 11 is compressed. The locking tenon 1 has a top provided with a protruding limit portion 13 inserted into the limit hole 221 of the panel 2 to prevent the locking tenon 1 from being detached from the receiving space 22 of the panel 2. The limit portion 13 of the locking tenon 1 is snapped into the limit hole 221 of the panel 2 when the elastic portion 11 is compressed. The limit portion 13 of the locking tenon 1 is located between the elastic portion 11 and the locking portion 12 and has a size smaller than that of the limit hole 221 of the panel 2 so that the limit portion 13 of the locking tenon 1 is movable in the limit hole 221 of the panel 2. The locking tenon 1 has a side provided with an upright press plate 14 which extends downward from the locking tenon 1 and protrudes outwardly from the opening 26 of the panel 2. The press plate 14 of the locking tenon 1 is located between the elastic portion 11 and the locking portion 12 and is movable toward the housing 3 by an elastic action of the elastic portion 11 to abut a bottom wall 34 of the locking slot 32 of the housing 3. The locking portion 12 of the locking tenon 1 is an inclined face directed toward the locking slot 32 of the housing 3 and is retained by the bottom wall 34 of the locking slot 32 of the housing 3. The elastic portion 11 of the locking tenon 1 is biased between the peripheral wall 24 of the panel 2 and the housing 3 to push the locking portion 12 toward the locking slot 32 of the housing 3 and to push the press plate 14 of the locking tenon 1 toward the bottom wall 34 of the locking slot 32 of the housing 3.

Figure 5:
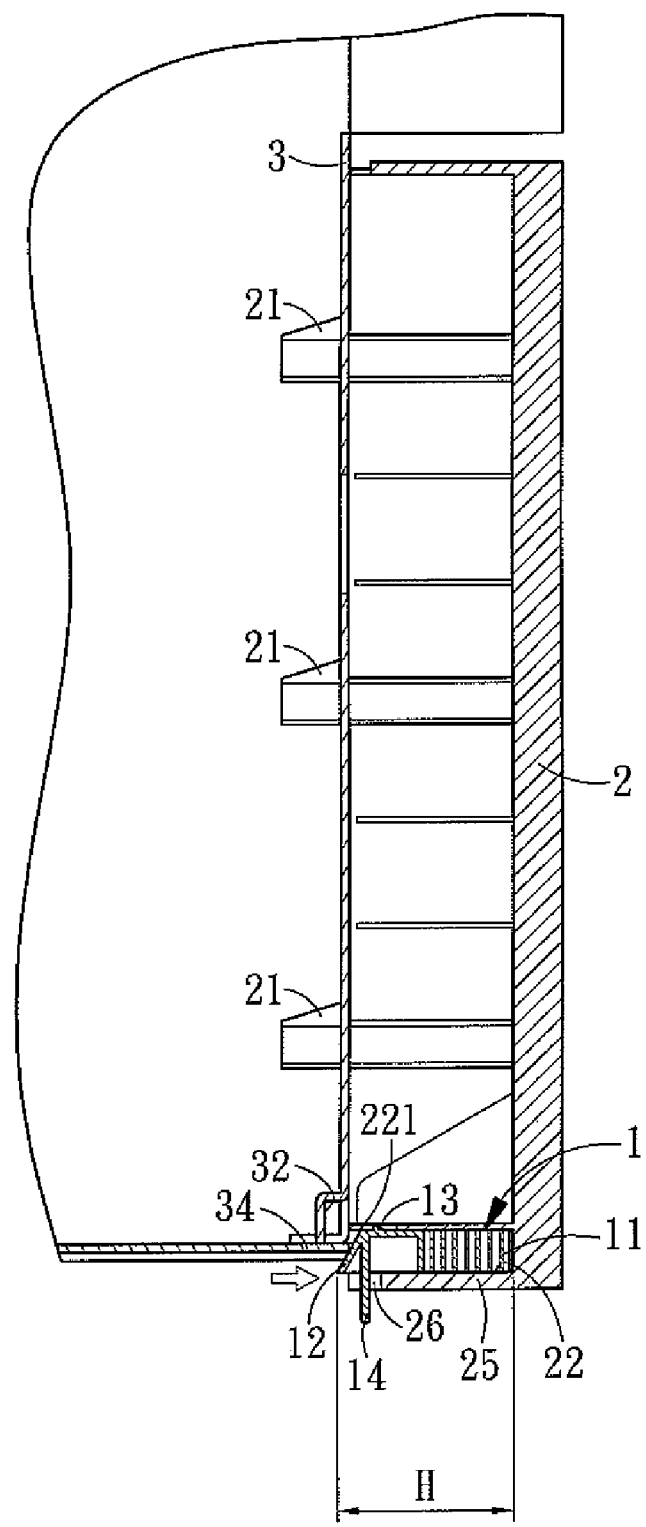
FIG. 5 is a schematic operational view of the panel and housing assembly as shown in FIG. 4.

In practice, when the elastic portion 11 of the locking tenon 1 is not compressed, the locking tenon 1 has a maximum length equal to H, so that the locking tenon 1 has a part protruding outwardly from the receiving space 22 of the panel 2 as shown in FIG. 5. On the other hand, when the elastic portion 11 of the locking tenon 1 is compressed, the locking tenon 1 has a minimum length equal to H' so that the locking tenon 1 is fully hidden in the receiving space 22 of the panel 2 as shown in FIG. 7.

Figure 2:
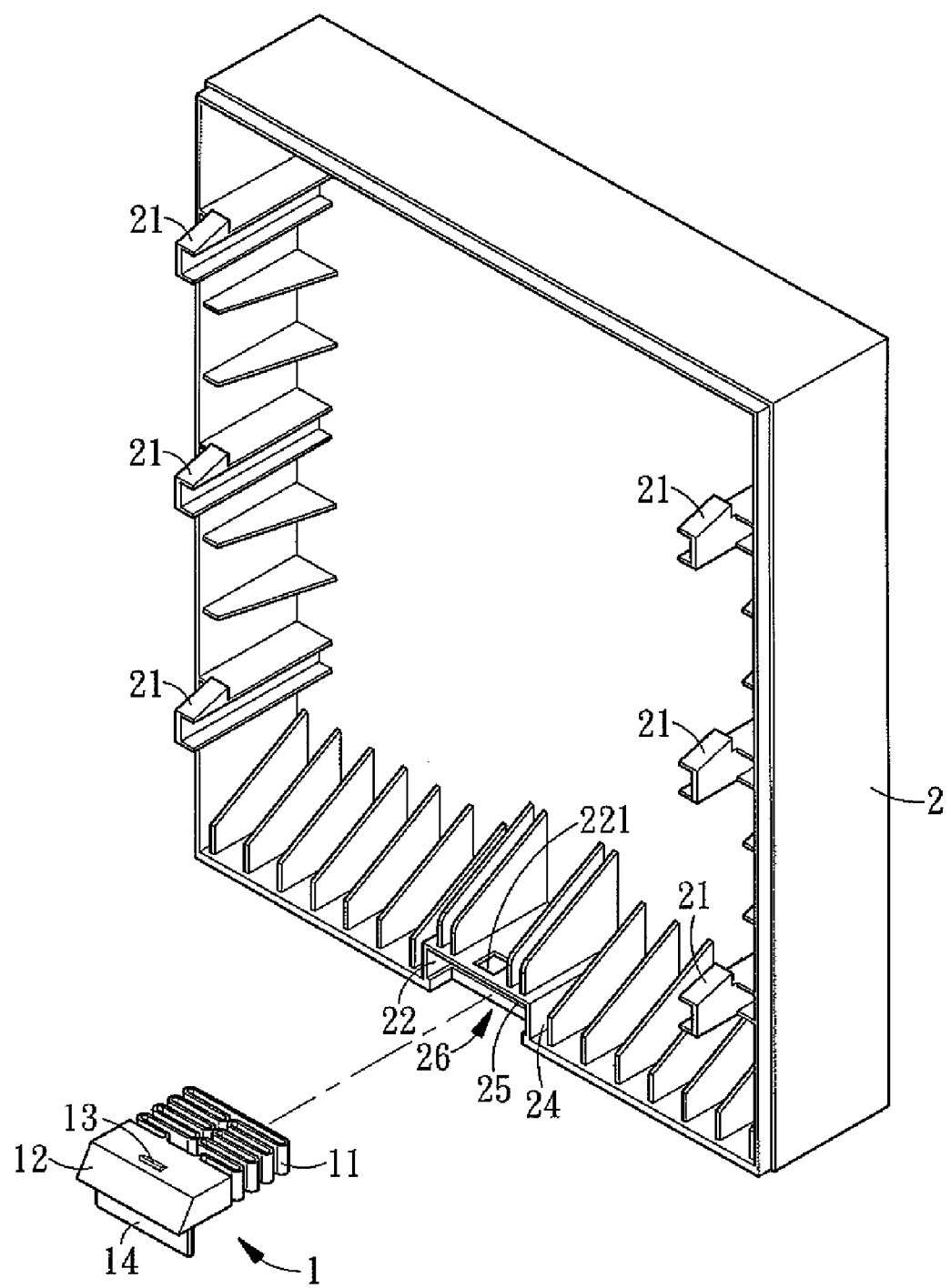
FIG. 2 is a locally enlarged view of the panel and housing assembly as shown in FIG. 1.
Figure 3:
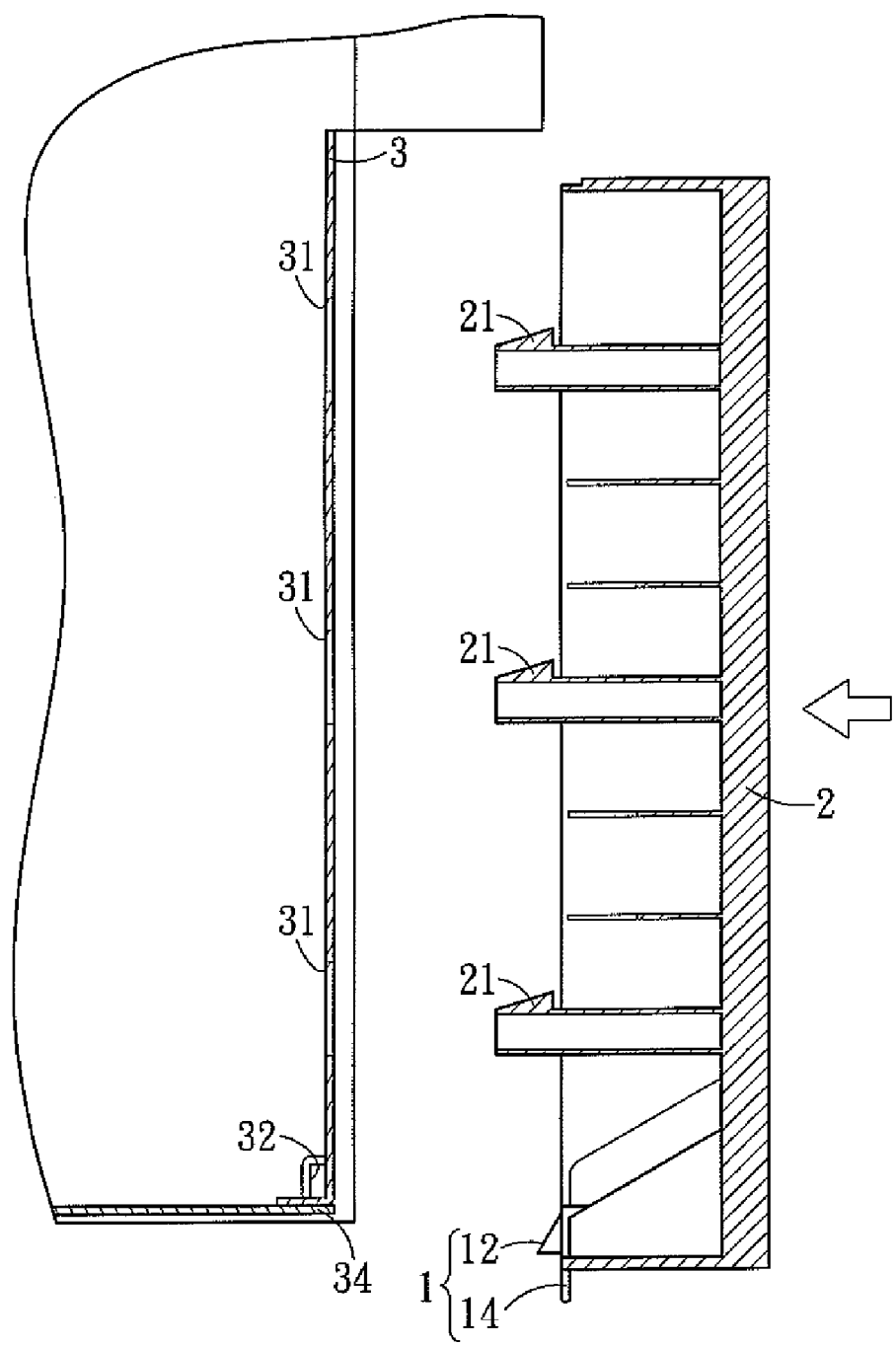
FIG. 3 is a side cross-sectional view of the panel and housing assembly as shown in FIG. 2.
Figure 4:
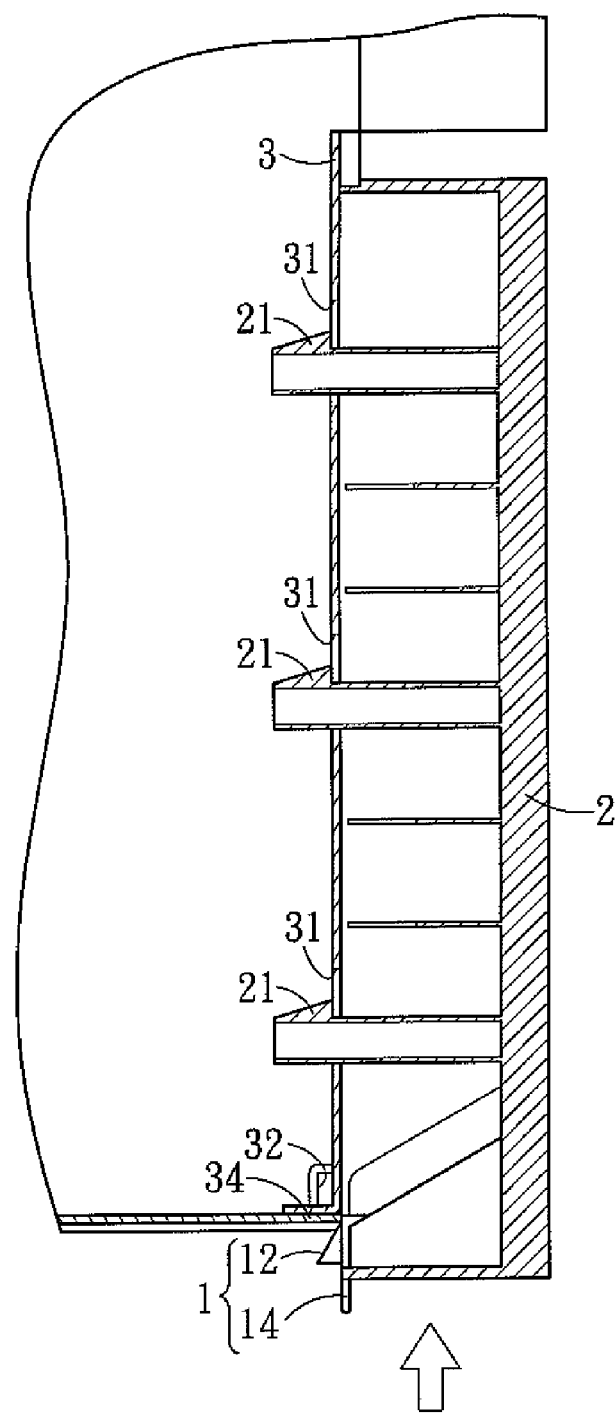
FIG. 4 is a schematic operational view of the panel and housing assembly as shown in FIG. 3.
Figure 6:
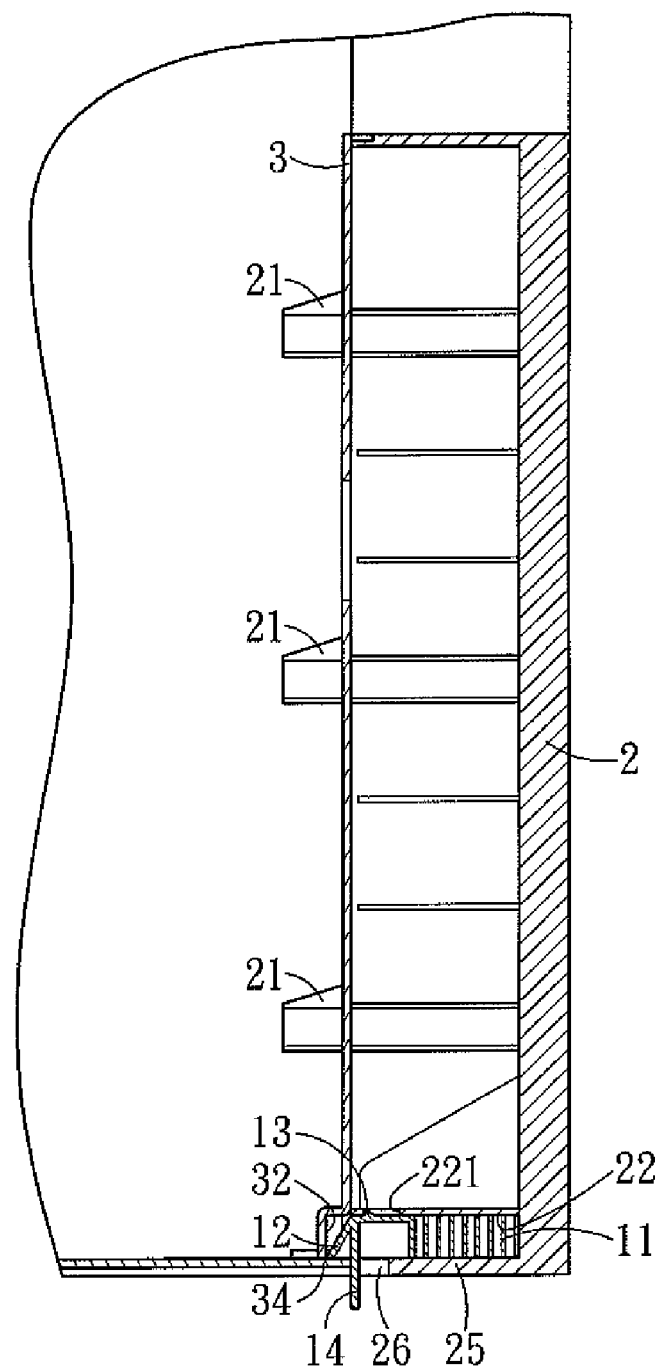
FIG. 6 is a schematic operational view of the panel and housing assembly as shown in FIG. 5.

In assembly, referring to FIGS. 3-6 with reference to FIGS. 1 and 2, the fixing hooks 21 of the panel 2 are moved toward and inserted into the fixing slots 31 of the housing 3 as shown in FIGS. 3 and 4. Then, the panel 2 is moved upward relative to the housing 3, so that the locking portion 12 of the locking tenon 1 is pressed by the bottom wall 34 of the locking slot 32 of the housing 3 as shown in FIG. 5 to push the locking tenon 1 toward the panel 2 and to compress the elastic portion 11 of the locking tenon 1. At this time, each of the fixing hooks 21 of the panel 2 is movable upward in the respective fixing slot 31 of the housing 3 when the panel 2 is moved upward relative to the housing 3. After the locking portion 12 of the locking tenon 1 detaches from the bottom wall 34 of the locking slot 32 of the housing 3 and aligns with the locking slot 32 of the housing 3, the locking portion 12 of the locking tenon 1 is pushed by the restoring force of the elastic portion 11 and is inserted into the locking slot 32 of the housing 3, so that the locking portion 12 of the locking tenon 1 is received in the locking slot 32 of the housing 3 and is retained by the bottom wall 34 of the locking slot 32 of the housing 3 as shown in FIG. 6 to lock the locking tenon 1 and the panel 2 onto the housing 3 and to prevent the panel 2 from being movable downward relative to the housing 3. At this time, each of the fixing hooks 21 of the panel 2 is retained by a wall of the respective fixing slot 31 of the housing 3 when the panel 2 is moved upward relative to the housing 3, so that each of the fixing hooks 21 of the panel 2 is locked in the respective fixing slot 31 of the housing 3. Thus, the panel 2 is locked onto the housing 3 by the locking tenon 1 and the fixing hooks 21. At this time, the press plate 14 of the locking tenon 1 is pushed by the elastic portion 11 to abut the bottom wall 34 of the locking slot 32 of the housing 3.

Figure 7:
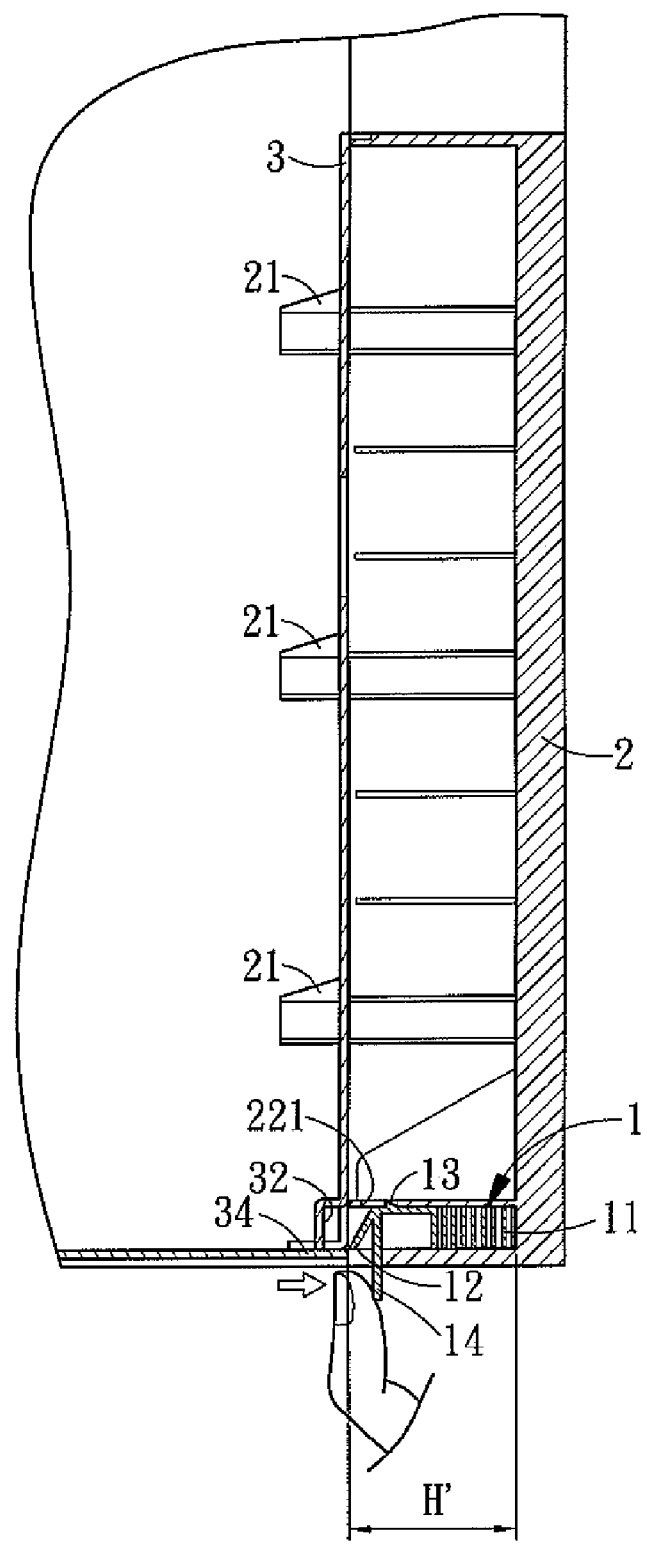
FIG. 7 is a schematic operational view of the panel and housing assembly as shown in FIG. 6.
Figure 8:
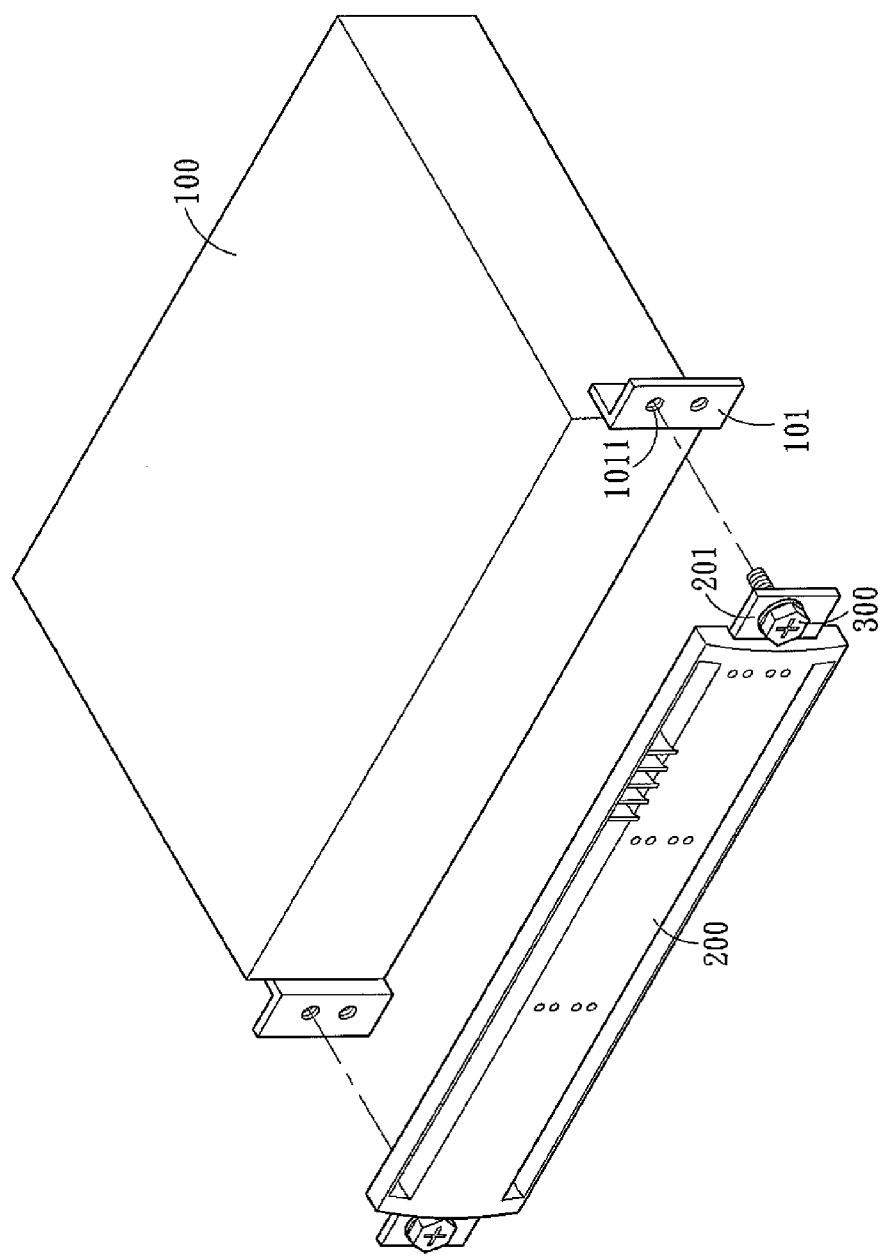
FIG. 8 is an exploded perspective view of a conventional panel and housing assembly in accordance with the prior art.
Figure 9:
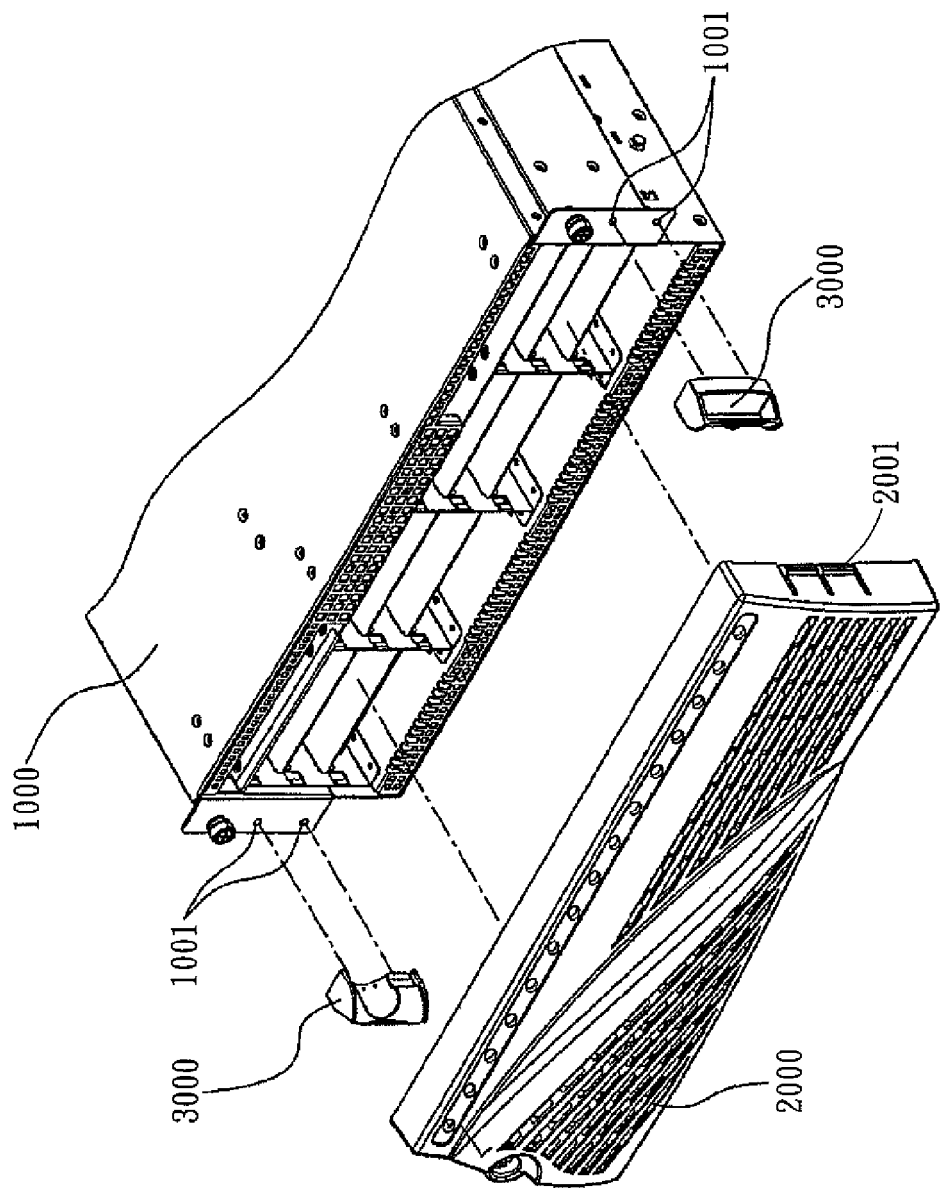
FIG. 9 is an exploded perspective view of another conventional panel and housing assembly in accordance with the prior art.

As shown in FIG. 7, the press plate 14 of the locking tenon 1 is pushed toward the panel 2 to compress the elastic portion 11 and to detach the locking portion 12 from the bottom wall 34 of the locking slot 32 of the housing 3 so as to unlock the locking tenon 1 from the housing 3, so that the panel 2 is movable downward relative to the housing 3 to detach the fixing hooks 21 of the panel 2 from the fixing slots 31 of the housing 3 so as to unlock the panel 2 from the housing 3. Thus, the panel 2 can be removed from the housing 3.

Accordingly, the panel 2 is locked onto the housing 3 by compressing the locking tenon 1 and unlocked from the housing 3 by pressing the press plate 14 of the locking tenon 1 so that the panel and housing assembly is assembled and disassembled easily and quickly without needing aid of any hand tool, thereby facilitating a user assembling and disassembling the panel and housing assembly. In addition, the locking tenon 1 has a simplified structure so that the locking tenon 1 is made easily, thereby decreasing the costs of fabrication of the panel and housing assembly. Further, the locking tenon 1 is not worn out or broken easily during a long-term utilization, thereby increasing the lifetime of the panel and housing assembly.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A panel and housing assembly, comprising:
   a housing provided with a locking slot;
   a panel removably mounted on the housing and provided with a receiving space;
   a locking tenon mounted between the housing and the panel and having a first end provided with an elastic portion received in the receiving space of the panel and a second end provided with a locking portion inserted into and locked in the locking slot of the housing;
   wherein the receiving space panel has a peripheral wall;
   the peripheral wall of the panel has a top provided with a limit hole connected to the receiving space;
   the locking tenon has a top provided with a protruding limit portion inserted into the limit hole of the panel to prevent the locking tenon from being detached from the receiving space of the panel.

2. The panel and housing assembly in accordance with claim 1, wherein
   the peripheral wall of the panel is formed on a bottom of the panel;
   the locking slot of the housing is located at a bottom of the housing.

3. The panel and housing assembly in accordance with claim 1, wherein the limit portion of the locking tenon is snapped into the limit hole of the panel when the elastic portion is compressed.

4. The panel and housing assembly in accordance with claim 1, wherein the limit portion of the locking tenon is located between the elastic portion and the locking portion.

5. The panel and housing assembly in accordance with claim 1, wherein the limit portion of the locking tenon has a size smaller than that of the limit hole of the panel so that the limit portion of the locking tenon is movable in the limit hole of the panel.

6. The panel and housing assembly in accordance with claim 1, wherein the locking tenon is fully hidden in the receiving space of the panel when the elastic portion is compressed.

7. The panel and housing assembly in accordance with claim 1, wherein the locking tenon partially protrudes outwardly from the receiving space of the panel by an elastic action of the elastic portion.

8. A panel and housing assembly, comprising:
a housing provided with a locking slot;
a panel removably mounted on the housing and provided with a receiving space;
a locking tenon mounted between the housing and the panel and having a first end provided with an elastic portion received in the receiving space of the panel and a second end provided with a locking portion inserted into and locked in the locking slot of the housing;
wherein the receiving space of the panel has a bottom wall provided with an opening;
the locking tenon has a side provided with an upright press plate which extends downward from the locking tenon and protrudes outwardly from the opening of the panel.

9. The panel and housing assembly in accordance with claim 8, wherein the press plate of the locking tenon is located between the elastic portion and the locking portion and is movable toward the housing by an elastic action of the elastic portion to abut a bottom wall of the locking slot of the housing.

10. The panel and housing assembly in accordance with claim 9, wherein the locking portion of the locking tenon is an inclined face directed toward the locking slot of the housing and is retained by the bottom wall of the locking slot of the housing.

11. The panel and housing assembly in accordance with claim 9, wherein the elastic portion of the locking tenon is biased between the panel and the housing to push the locking portion toward the locking slot of the housing and to push the press plate of the locking tenon toward the bottom wall of the locking slot of the housing.

12. The panel and housing assembly in accordance with claim 9, wherein
the locking portion of the locking tenon is pressed by the bottom wall of the locking slot of the housing when the panel is moved upward relative to the housing to push the locking tenon toward the panel and to compress the elastic portion of the locking tenon;
the locking portion of the locking tenon is movable to a position where the locking portion of the locking tenon detaches from the bottom wall of the locking slot of the housing and aligns with the locking slot of the housing, and the locking portion of the locking tenon is pushed by a restoring force of the elastic portion and is inserted into the locking slot of the housing, so that the locking portion of the locking tenon is received in the locking slot of the housing and retained by the bottom wall of the locking slot of the housing.

13. The panel and housing assembly in accordance with claim 12, wherein the press plate of the locking tenon is pushed by the elastic portion to abut the bottom wall of the locking slot of the housing when the locking portion of the locking tenon is received in the locking slot of the housing and retained by the bottom wall of the locking slot of the housing.

14. The panel and housing assembly in accordance with claim 13, wherein the press plate of the locking tenon is movable toward the panel to compress the elastic portion and to detach the locking portion from the bottom wall of the locking slot of the housing.

15. A panel and housing assembly, comprising:
a housing provided with a locking slot;
a panel removably mounted on the housing and provided with a receiving space;
a locking tenon mounted between the housing and the panel and having a first end provided with an elastic portion received in the receiving space of the panel and a second end provided with a locking portion inserted into and locked in the locking slot of the housing;
wherein the housing is provided with a plurality of fixing slots;
the panel is provided with a plurality of fixing hooks each inserted into and locked in a respective fixing slot of the housing.

16. The panel and housing assembly in accordance with claim 15, wherein the
each of the fixing slots of the housing is perpendicular to the locking slot;
each of the fixing slots of the housing is disposed at a vertical state, and the locking slot of the housing is disposed at a horizontal state.

17. The panel and housing assembly in accordance with claim 15, wherein
each of the fixing slots of the housing has an elongate shape;
the locking slot of the housing has an elongate shape;
each of the fixing hooks of the panel has a size smaller than that of the respective fixing slot of the housing so that each of the fixing hooks of the panel is movable in the respective fixing slot of the housing when the panel is movable relative to the housing.

18. The panel and housing assembly in accordance with claim 15, wherein
the fixing slots of the housing are located at two opposite sides of the housing;
the fixing hooks of the panel are located at two opposite sides of the housing.

* * * * *